(12) United States Patent
Basol et al.

(10) Patent No.: US 8,318,530 B2
(45) Date of Patent: Nov. 27, 2012

(54) SOLAR CELL BUFFER LAYER HAVING VARYING COMPOSITION

(75) Inventors: Bulent M. Basol, Manhattan Beach, CA (US); Mustafa Pinarbasi, Morgan Hill, CA (US); James Freitag, Sunnyvale, CA (US)

(73) Assignee: SoloPower, Inc., San Jose, CA (US)

( * ) Notice: Subject to any disclaimer, the term of this patent is extended or adjusted under 35 U.S.C. 154(b) by 0 days.

(21) Appl. No.: 12/843,778

(22) Filed: Jul. 26, 2010

(65) Prior Publication Data

US 2011/0039366 A1    Feb. 17, 2011

Related U.S. Application Data

(60) Provisional application No. 61/228,418, filed on Jul. 24, 2009.

(51) Int. Cl.
*H01L 21/00* (2006.01)
(52) U.S. Cl. .................... 438/84; 438/87; 257/E31.027; 257/E31.015
(58) Field of Classification Search .................... 438/87; 257/E31.015, E31.027
See application file for complete search history.

(56) References Cited

U.S. PATENT DOCUMENTS

| 5,078,804 A * | 1/1992 | Chen et al. ..................... 136/260 |
| 5,800,631 A * | 9/1998 | Yamada et al. ................ 136/251 |
| 6,537,845 B1 | 3/2003 | McCandless et al. |
| 2006/0180200 A1* | 8/2006 | Platzer Bjorkman et al. 136/265 |
| 2008/0178932 A1* | 7/2008 | Den Boer et al. ............. 136/256 |
| 2008/0318034 A1* | 12/2008 | Murakami et al. ............ 428/336 |
| 2009/0258457 A1* | 10/2009 | Britt et al. ....................... 438/95 |

* cited by examiner

*Primary Examiner* — Kevin Parendo
(74) *Attorney, Agent, or Firm* — Pillsbury Winthrop Shaw Pittman LLP

(57) ABSTRACT

Described is a continuous electroless deposition method and a system to form a solar cell buffer layer with a varying composition through its thickness are provided. The composition of the buffer layer is varied by varying the composition of a chemical bath deposition solution applied onto an absorber surface on which the buffer layer with varying composition is formed. In one example, the buffer layer with varying composition includes a first section containing CdS, a second section containing CdZnS formed on top of the already deposited CdS, and a third section containing ZnS is formed on the second section All the process steps are applied in a roll-to-roll fashion. In another example, a transparent conductive layer including a first transparent conductive film such as aluminum doped zinc oxide and a second transparent conductive film such as indium tin oxide is deposited over the buffer layer with the varying composition.

9 Claims, 4 Drawing Sheets

SOLAR CELL BUFFER LAYER HAVING VARYING COMPOSITION

RELATED APPLICATIONS

This application is related to and claims priority from U.S. Provisional Application No. 61/228,418 entitled "Method and Apparatus For Electroless Deposition of Graded or Multi-layer Films" filed on Jul. 24, 2009, which is expressly incorporated by reference herein.

BACKGROUND

1. Field of the Inventions

The present inventions relate to roll-to-roll continuous manufacturing of Group IBIIIAVIA solar cells and more specifically to apparatus and method for fabricating thin film solar cells employing compound buffer layers and transparent conductive layers.

2. Description of the Related Art

Solar cells are photovoltaic (PV) devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu,Ag,Au), Group IIIA (B,Al,Ga,In,Tl) and Group VIA (O,S,Se,Te,Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications. It should be noted that although the chemical formula for the absorbers is often written as $Cu(In,Ga)(S,Se)_2$, a more accurate formula for the compound is $Cu(In,Ga)(S,Se)_k$, where k is typically close to 2 but may not be exactly 2. For simplicity we will, occasionally, continue to use the value of k as 2. It should be further noted that the notation "Cu(X,Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal (such as aluminum or stainless steel), an insulating foil or web, or a conductive foil or web. The absorber film 12, which includes a material in the family of $Cu(In,Ga,Al)(S,Se,Te)_2$, is grown over a conductive layer 13, which is previously deposited on the substrate 11 and which acts as the electrical contact to the device. The structure including the substrate 11 and the conductive layer 13 or the contact layer, is often called a base 16. Various conductive layers comprising Mo, Ta, W, Ti, and nitrides of these materials etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. It should be noted that the structure of FIG. 1 may also be inverted if substrate is transparent. In that case light enters the device from the substrate side of the solar cell.

In a thin film solar cell employing a Group IBIIIAVIA compound absorber, the transparent layer 14 often comprises a stack structure comprising a buffer layer and a transparent conductive layer. The transparent layer 14, itself may comprise a stack such as an undoped-ZnO/doped-ZnO stack, an undoped-ZnO/In—Sn—O (ITO) stack etc. In manufacturing the cell, the buffer layer is first deposited on the Group IBIIAVIA absorber film 12 to form an active junction. Then the transparent conductive layer is deposited over the buffer layer to provide the needed lateral conductivity.

Various buffer layers with various chemical compositions have been evaluated in solar cell structures. Compounds such as CdS, ZnS, Zn—S—OH, Zn—S—O—OH, ZnO, Zn—Mg—O, Cd—Zn—S, ZnSe, In—Se, In—Ga—Se, In—S, In—Ga—S, In—O—OH, In—S—O, In—S—OH, etc. are some of the buffer layer materials that have been reported in the literature. Buffer layers for Group IBIIIAVIA devices such as CIGS(S) solar cells are typically 5-200 nm thick and may be deposited by various techniques such as evaporation, sputtering, atomic layer deposition (ALD), electrodeposition and chemical bath deposition (CBD), etc.

Chemical bath deposition (CBD) is the most commonly used method for the formation of buffer layers on CIGS(S) absorber films. The technique involves preparation of a chemical bath comprising the chemical ingredients of the buffer layer to be formed. The temperature of the bath is raised to a typical range of 50-90° C. and the surface of the CIGS(S) film is exposed to the heated bath. Alternately, the substrate containing the CIGS(S) film may be heated and then dipped into the chemical bath kept at a lower temperature as described in U.S. Pat. No. 6,537,845. A thin buffer layer grows onto the CIGS(S) film as a result of homogeneous chemical reactions initiating upon application of heat to the bath and/or to the substrate carrying the CIGS(S) film. Since there is no voltage applied during deposition, the technique may sometimes be referred to as "electroless deposition". An exemplary CBD process for the growth of a cadmium sulfide (CdS) buffer layer employs a chemical bath comprising cadmium (Cd) species (from a Cd salt source such as Cd-chloride, Cd-sulfate, Cd-acetate, etc.), sulfur (S) species (from a S source such as thiourea) and a complexing agent (such as ammonia, triethanolamine (TEA), diethanolamine (DEA), ethylene diamine tetra-acetic acid (EDTA), etc) that regulates the reaction rate between the Cd and S species. Once the temperature of such a bath is increased to the 50-90° C. range, the reaction between the Cd and S species initiates homogeneously everywhere in the solution. As a result, a CdS layer forms on all surfaces wetted by the heated solution and CdS particles form homogeneously within the solution. The reaction rate between Cd and S species is a function of temperature. The rate increases as the temperature is increased and it decreases as the temperature is reduced.

The prior art CBD processes are batch processes. In other words, in these prior-art methods a pre-measured amount of the bath or solution is used to form a buffer layer on a pre-selected surface area of a structure, such as a solar cell structure. After formation of the buffer layer on the pre-selected surface area of the structure, the used bath is discarded along with the particles formed within the bath. As can be appreciated from this brief review, such prior-art approaches generate large amounts of chemical waste and increase cost since actual materials utilization to form the buffer layer on the surface of the structure is very low, typically lower than 20%. Most of the buffer layer material is wasted on forming a film on the walls of the reactor holding the CBD solution, and on forming particles of the buffer layer material within the solution. The present invention increases materials utilization of the CBD processes, reduces waste, and allows continuous deposition of materials on substrates which may be in the form of rolled foils.

SUMMARY

The present inventions are related to apparatus and methods for fabricating thin film solar cells employing a chemical bath deposited buffer layer.

In a particular aspect, there is described a method of forming a buffer layer over a front surface of a flexible workpiece including an absorber layer during the manufacture of a solar cell, comprising: advancing a first segment of the flexible workpiece through a first deposition zone while also dispensing a first deposition solution onto the first segment so that the first deposition solution is flowed over the front surface of an absorber layer of the workpiece towards a second deposition zone, wherein the flexible workpiece includes a substrate, a contact layer disposed over the substrate, and the absorber layer disposed over the contact layer; electrolessly depositing, from the first electroless deposition solution, a first section of the buffer layer on the first segment of the workpiece in the first deposition zone; advancing the first segment of the workpiece into and through the second deposition zone while also dispensing a second electroless deposition solution over the first section of the buffer layer within the second deposition zone so that the second electroless deposition solution is flowed in a same direction as the advancing first segment within the second deposition zone, wherein a second segment of the workpiece adjacent to the first segment of the workpiece is moved into the first deposition zone and also has the first electroless deposition solution dispensed thereon as the first segment of the workpiece is advanced into and through the second deposition zone; and electrolessly depositing, from an electroless deposition solution, a second section of the buffer layer on the first section of the buffer layer in the second deposition zone, wherein the electroless deposition solution includes at least the second electroless deposition solution, and wherein the electrolessly depositing from the electroless deposition solution occurs as another first section of the buffer layer is deposited from the first electroless deposition solution onto the second segment of the workpiece in the first deposition zone.

In another aspect, there is described, a method of forming a solar cell, comprising: providing a substrate; forming an absorber layer over the substrate, wherein the absorber layer includes at least one of a Cu(In,Ga)Se$_2$ and a CdTe; depositing a buffer layer on the absorber layer, wherein the buffer layer includes a lower section and a top section of the buffer layer, such that the lower section is deposited prior to the top section, and wherein a composition of the lower section is different than the composition of the top section of the buffer layer; and depositing a transparent conductive layer over the buffer layer.

These and other aspects are described herein.

DETAILED DESCRIPTION OF THE PREFERRED EMBODIMENTS

The methods of the present inventions form films with a varying composition through their thickness using a continuous deposition process. The composition of the deposited film varies as the thickness of the film is increased using the deposition processes of the present inventions. The process yields layers with compositional profile. The composition of the film may be varied by varying the composition of a CBD solution applied onto a surface on which the film with varying composition is formed. For example, a first solution with a first and second species may be applied on the surface to form a first section of the film including the first and second species. As the first section is formed and while the first solution is continued to be applied, a third species may be added to the first solution to initiate the formation of a second section of the growing film, on top of the already deposited first section, the second section having the composition of the first, second and third species. The third species may be added by mixing a second solution containing the third species to the first solution, all these processes being applied in a roll-to-roll fashion. As the second section of the film is formed, the amount of the first species is effectively diluted and thus reduced (i.e. the molar ratio of the third species to the first species is increased) so that a third section containing only the second and third species may be built on the second section of the film with varying composition.

In one embodiment, the process of the present invention is used to form a buffer layer or a graded buffer layer on an absorber surface. Here, each of the first species, the second species, third species, and so on may be selected from the group including, but not limited to, cadmium (Cd), zinc (Zn), magnesium (Mg), indium (In), gallium (Ga), sulfur (S), and selenium (Se). For example, if the first species is Cd, the second species is S and the third species is Zn, a buffer layer may be grown on a surface wherein the composition of the film may change from CdS to CdZnS, or from CdS (as the first section) to CdZnS (as the second section) and to ZnS (as the third section).

In another embodiment, a transparent conductive layer including a first transparent conductive film deposited on a buffer layer and a second transparent conductive film deposited on the first transparent conductive film is provided. The first transparent conductive film and the second transparent conductive films are different transparent conductive oxide layers. The first transparent conductive film may be thicker than the second transparent conductive film and may have a higher electrical resistivity than the second transparent conductive film. The buffer layer used in this embodiment may be the above described graded buffer layer, i.e., a buffer layer with compositional gradient or varying composition, or a conventional CdS and/or ZnS buffer layers or film stacks.

Figure 1:
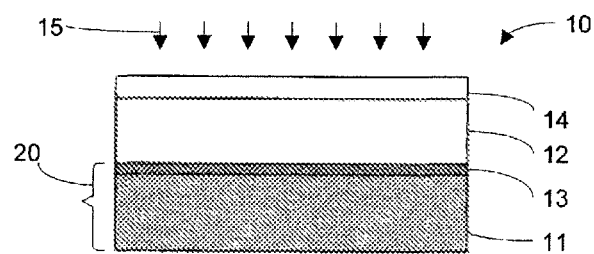
FIG. 1 is a cross-sectional view of a solar cell employing a Group IBIIIAVIA absorber layer.
Figure 2:
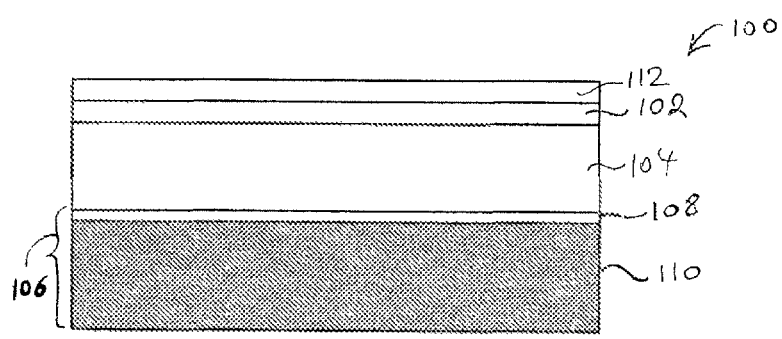
FIG. 2 is a schematic side view of a solar cell structure including a buffer layer.

FIG. 2 shows a portion of a multilayer solar cell structure 100 including a buffer layer 102 with a varying composition or compositional profile. The buffer layer 102 of the present invention is formed over an absorber layer 104, preferably a CdTe or a CIGS absorber layer. The absorber layer 104 is formed over a base 106 including a contact layer 108 formed on a substrate 110. The contact layer 108 may be a molybdenum (Mo) layer, and the substrate may be a conductive flexible substrate such as a stainless steel or aluminum substrate. Once the buffer layer 102 is formed over the absorber layer 104, a transparent conductive layer 112 such as a transparent conductive oxide or multiple layers of transparent conductive oxides may be formed on the buffer layer in a following step.

Figure 3:
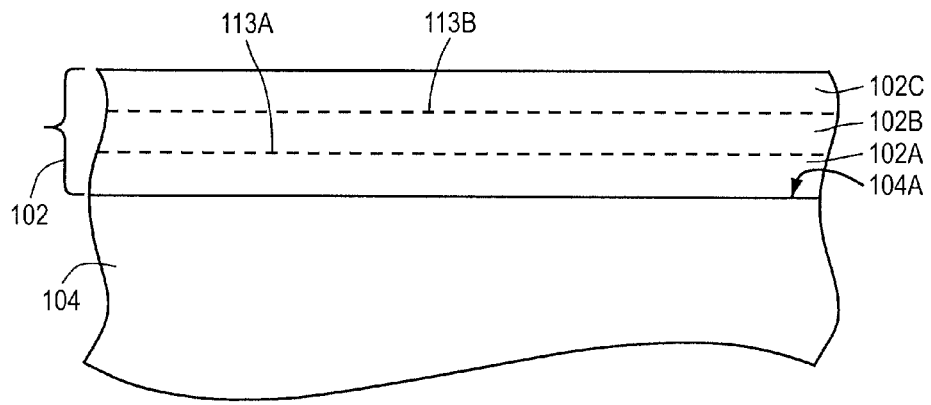
FIG. 3 is a detail schematic side view of a portion of the buffer layer shown in FIG. 2.

FIG. 3 shows an exemplary portion of the buffer layer 102 in more detail. In this embodiment, a first section 102A of the buffer layer may be formed on a top surface 104A of the absorber layer, a second section 102B of the buffer layer 102 is formed on the first section 102A, and a third section 102C is formed on the second section 102B. It will be appreciated that the sections 102A, 102B and 102C are not well defined layers, and for this reason are referred to as sections above; therefore they are not separated from one another by abrupt physical boundaries. Their compositions also may not change abruptly but may be graded, although as will be described below an abrupt compositional change is also possible. The buffer layer 102 is deposited using electroless wet methods such as CBD (chemical bath deposition) while changing the composition of the deposition solution and thus the depositing film in-situ as the buffer layer is grown. There may be transition regions between the neighboring sections. Such as a first transition region 113A between the first section 102A and the second section 102B, and a second transition region 113B between the second section 102B and the third section 102C of the buffer layer 102. Each transition region may include the compositional characteristics of the neighboring two sections. In this embodiment, the first section may include CdS, the second section includes CdZnS, and the third section includes a composition close to ZnS. Alternately, the first section may be ZnS, the second section may comprise CdZnS and the third section may comprise mostly CdS.

Figure 4:
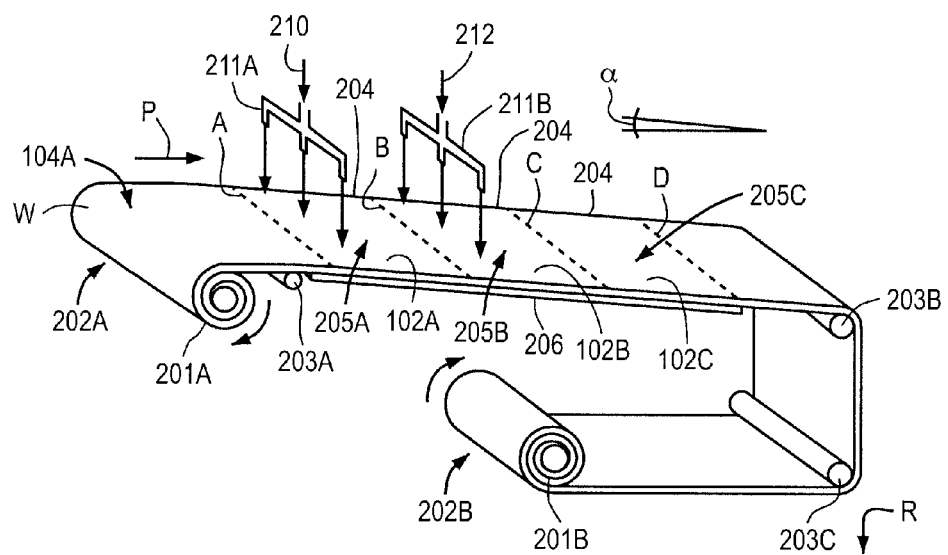
FIG. 4 is a schematic illustration of an embodiment of a roll-to-roll deposition system to deposit the buffer layer on top of a continuous workpiece.

FIG. 4 shows an exemplary roll to roll CBD system 200 that may be employed to deposit the buffer layer 102 of the present inventions over a workpiece W which includes the absorber layer 104 formed on the base 106 shown in FIG. 2. The surface 104A of the absorber layer forms the top surface of the workpiece W. The workpiece W is extended between a supply roll 201A and a receiving roll 201B in a slanted manner, and supported and oriented by rollers 203A, 203B and 203C as the supply roll end position is higher than the roller 203B end positions shown in FIG. 4. In this embodiment an angle of slant 'α' is the angle between the surface plane of the workpiece and a horizontal plane perpendicular to the plane of paper and may be in range of 2 to 20 degrees. The workpiece W is unwound from the supply roll 201A at a first end 202A of the system, advanced in a process direction depicted by arrow 'P', and wound as the receiving roll 201B at a second end 202B. A process area of the workpiece W, shown between dotted lines A-D, is supported by or across from a support plate 206. The support plate 206 may be heated during the stages of the deposition process to heat different parts of the process area to enable electroless material deposition from the solutions, such as process solutions 210 and 212, that have been dispensed onto the process area from, for example as shown, a first solution supply mechanism such as nozzle 211A, and a second solution supply mechanism such as a second nozzle 211B. For example, the process area between dotted lines B-C can be heated to another temperature or temperature profile over time, and the process area between dotted lines C-D can be heated to still another temperature or temperature profile over time, though it of course understood that these different profile area regions could also all have the same temperature or temperature profile over the process area of interest, such as the process area between dotted line region A-B. It is further noted that the process solutions 210 and 212 are applied in such a manner so as to have a substantially uniform coverage across the entire workpiece W, and a determined profile coverage in the in the lengthwise direction of the workpiece W, which coverage will be dependent on the process solution used, the slant angle, the top surface of the workpiece W, and the temperature, as well as other considerations as noted herein. Used solutions (shown as arrow R) may be collected and the workpiece W may be cleaned and dried as it travels away from the roller 203C and before it is wound up as the receiving roll 201B. The workpiece W may or may not touch the support plate 206.

FIG. 4 further shows a workpiece segment 204 advancing in three sequential buffer layer growth locations to grow the first section 102A, the second section 102B and the third section 102C of the buffer layer over the workpiece segment 204. Accordingly, a first growth location 205A is between the dotted lines A and B, a second growth location 205B is between the dotted lines B and C, and a third growth location 205C is between the dotted lines C and D. Each growth location occupies a predetermined area which corresponds to the thickness of the film section to be grown, longer growth location corresponding to thicker film growth. During the process, when the workpiece segment 204 is advanced between the dotted lines A and B in the first growth location 205A, the first section 102A is grown on the surface 104A; next, as the workpiece segment 204 is advanced between the dotted lines B and C in the second growth location 205B, the second section 102B of the film is grown on the first section 102A; and, as the workpiece segment 204 is advanced between the dotted lines C and D in the third growth location 205C, the third section 102C is grown on the second section 102B.

Referring to FIG. 4, in an exemplary process, once the workpiece segment 204 is advanced into the first growth location 205A, initially a first solution 210 including Cd and S species is delivered along the line 'A' onto the surface 104A to start the growth of the first section 102A of the buffer layer on the advancing workpiece segment 204. At the same time a second solution 212 including Zn species is delivered along the line 'B' so that as the workpiece segment 204 with the first section 102A of the buffer layer 102 is advanced into the second growth location 205B, the second section 102B including CdZnS starts growing on the first section 102A. It should be noted that due to the slanted posture of the workpiece W, in this embodiment, the first and second solutions are mixed at the second growth location 205B. Therefore, whereas the first solution 210 comprises Cd and S species within the first growth location, the mixed solution of the first and second solutions comprises Cd, S and Zn in the second growth location. As the workpiece segment 204 with the first and second sections of the buffer layer 102 is advanced into the third growth location, Cd concentration may become significantly depleted in the mixed solution because of more efficient Cd inclusion during CdZnS growth. As a result the solution mixture at the third growth location may become highly Zn rich, and the third section 102C of the buffer layer may grow from this Zn rich solution resulting in a near-ZnS composition. Alternately, it is also possible to introduce more Zn species along the line C to further enhance the Zn concentration of the deposition solution within the third growth location 205C. The first and the second solutions 210 and 212 may be delivered through a first solution supply mechanism such as a first nozzle 211A, and a second solution supply mechanism such as a second nozzle 211B. There may be more solutions introduced on the surface of the workpiece along more growth locations.

Figure 5:
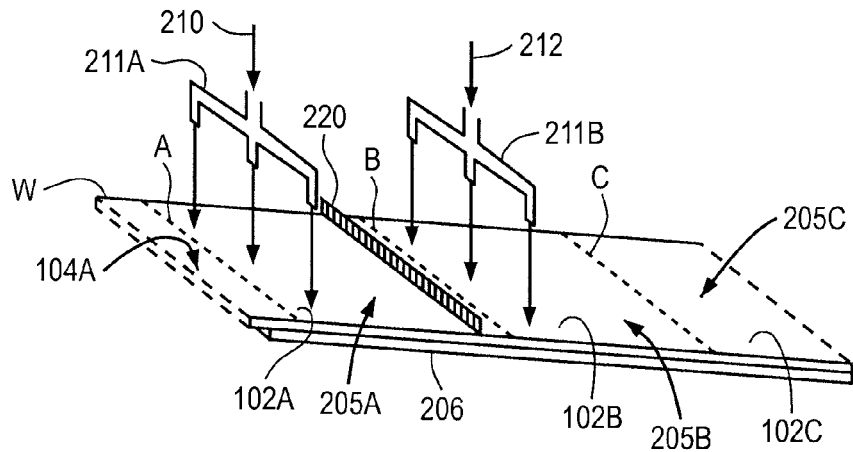
FIG. 5 is a schematic partial view of the roll to roll deposition system including a solution barrier placed on top of the continuous workpiece.

FIG. 5 shows, in partial view, a solution barrier 220 placed on top of the workpiece W to block the first solution 210 from flowing into the second growth location 205B. In this embodiment the solution barrier 220 such as a brush or squeegee is placed along the dotted line B before the second growth location 205B so that the first solution 210 only flows over the first growth location 205A between the dotted lines A and B when the workpiece segment 204 is advanced within the first growth location. Excess solution is diverted by the solution blocker 220 to the sides and taken into a solution drain (not shown). Consequently, CdS only deposits in the first growth location 205A and forms the first section 102A. Because of the solution barrier 220 the second solution 212 flows over the second growth location 205B and the third growth location 205C and deposits ZnS thereon. As a result the second section 102B and the third section 102C become ZnS. This way the compositional boundary between the first section 102A and the second section 102B can be made. It will be appreciated that although the deposition process is described using a segment of the workpiece, the deposited sections, thus the buffer layer, are formed on the entire surface of the workpiece in a continuous manner using the principles of the roll to roll process.

Figure 6:
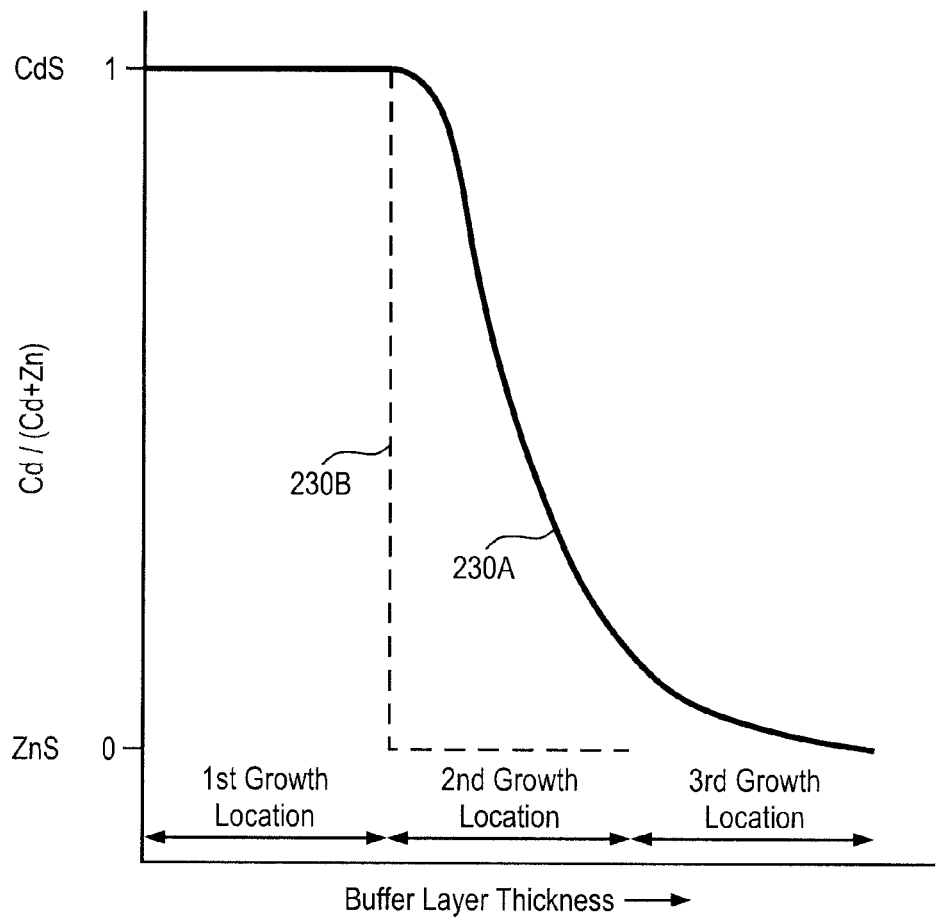
FIG. 6 is graph showing buffer layer compositional variations throughout a buffer layer thickness for two embodiments of the deposition process.
Figure 7:
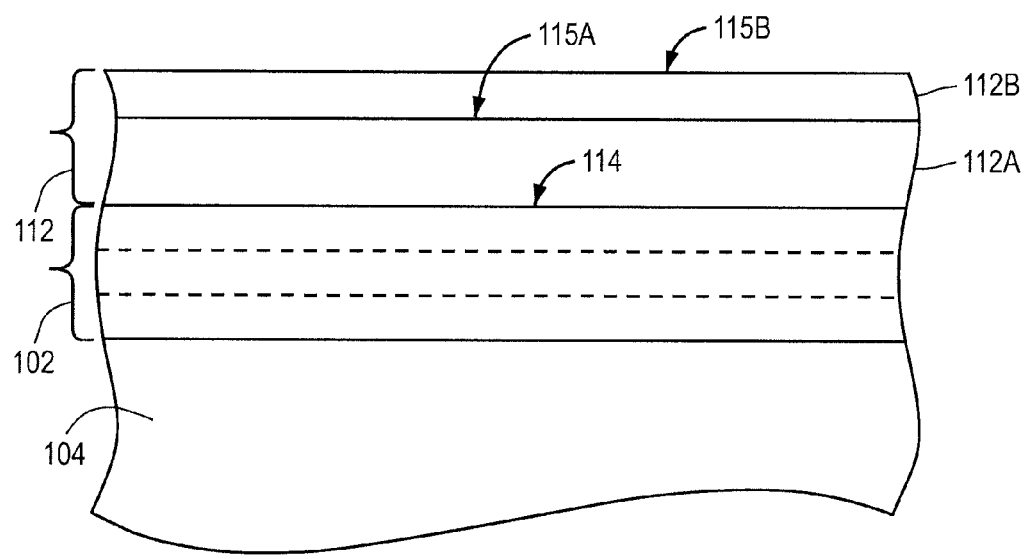
FIG. 7 is a schematic side view of an embodiment of a solar cell structure having a transparent layer.

A first graph 230A or sketch in FIG. 6 shows an example of a composition profile through the thickness of a buffer layer deposited using the system 200 shown in FIG. 4. As can be seen from the graph 230A, at the first growth location CdS was predominantly deposited on the workpiece surface. At the second growth location, CdZnS with varying Cd and Zn content (graded composition) was formed. ZnS deposition was predominant in the third growth location. A second graph 230B in FIG. 6 represents a deposition process using the solution barriers 220 shown in FIG. 5. Because of the solution barrier 220, CdS deposits at the first growth location then CdS deposition is abruptly discontinued at a predetermined buffer layer thickness forming the first section of the buffer layer. Then substantially pure ZnS deposition takes place at the second and optionally third growth locations. FIG. 7 shows the exemplary transparent conductive layer 112 shown in FIG. 2 in more detail. In this embodiment, the transparent conductive layer 112 may be a multilayer transparent conductive layer including at least a first transparent conductive film 112A and a second transparent conductive film 112B. The first transparent conductive film 112A, is deposited on a top surface 114 of the buffer layer 102. Although in this embodiment, the buffer layer 102 is the above described compositionally varying buffer layer having, for example, sections 102a, 102b and 102c, a conventional CdS film or a ZnS film, or a CdS/ZnS film stack may instead be used. The second transparent conductive film 112B of the transparent conductive layer 112 is deposited on a top surface 115A of the first transparent conductive film 112B.

The multilayer nature of the transparent conductive layer 112 offers a cost effective and environmentally durable transparent conductive layer which may be an alternative to conventional single layer transparent conductive layers such as indium tin oxide (ITO) or zinc oxide based transparent conductive materials such as doped zinc oxides, for example, aluminum doped zinc oxide (Al—ZnO). Although transparent and conductive, such materials have differences in terms of electrical conductivity, cost and susceptibility to environmental conditions that the solar cells made of such materials are exposed. For example, doped ZnO materials are generally lower cost materials; however, they are environmentally sensitive materials and susceptible to environmental degradation. Under the harsh conditions in which PV modules must operate, transparent conductive layers made of Al—ZnO may degrade leading to a loss of module performance and output. On the other hand, transparent conductive layers made of indium tin oxide (ITO) are known to have superior resistance to environmental degradation, although they are more expensive. ITO also has lower electrical resistivity than Al—ZnO material Accordingly, in the preferred embodiment, the first transparent conductive film 112A may be a film of conductively doped ZnO, such as Al—ZnO, and the second transparent conductive film 112B may be a film of ITO. In this multilayer configuration, a thin layer of ITO as a capping layer on top of Al—ZnO advantageously improves both the electrical resistivity and the resistance to environmental degradation of the transparent conductive layer 112 while reducing its cost. The Al—ZnO film and the ITO film may be deposited using PVD methods. A thickness range for the first film 112A may be in the range of 100-500 nm, preferably 100-200 nm. A thickness range for the second film 112B may be in the range of 5-200 nm, preferably 50-100 nm, particularly when used with the first film 112A. The first film may comprise other conductively doped zinc oxides such as boron doped zinc oxide (B—ZnO), gallium doped zinc oxide (Ga—ZnO) and fluorine doped zinc oxide (F—ZnO).

Optionally, a further transparent layer (not shown), such as an intrinsic zinc oxide layer (i-ZnO) may be deposited on the buffer layer 102 and then the transparent conductive layer 112 is formed on this further transparent layer. A thickness range for this further transparent layer, particularly when it is an i-ZnO layer, may be in the range of 25-250 nm. In a possible subsequent step, a conductive grid (not shown) may be formed on a top surface 115B of the transparent layer 112 to complete the solar cell.

Although the present invention is described with respect to certain preferred embodiments, modifications thereto will be apparent to those skilled in the art.

We claim:
1. A method of forming a solar cell, comprising:
   providing a substrate;
   forming an absorber layer over the substrate, wherein the absorber layer includes at least one of Cu(In,Ga)Se$_2$ and CdTe;
   depositing a single buffer layer on the absorber layer in a single process step during which a composition of deposited material is changed to obtain a graded composition profile, wherein the single buffer layer includes a lower section and a top section, such that during the single process step the lower section is formed prior to the top section, and wherein the composition of depos- ited material of the lower section is CdS and the composition of deposited material of the top section is CdZnS with a graded amount of Cd and Zn within the top section, wherein the step of depositing the single buffer layer includes providing the graded amount of Cd and Zn within the top section such that the amount of Cd is reduced toward a top surface of the top section and the amount of Zn is increased toward the top surface of the top section, and wherein a ratio of Cd/(Cd+Zn) in the single buffer layer follows a shape determined by the graded composition profile with CdS material predominantly formed in a first growth location during a first period of the single process step, CdZnS material with varying Cd and Zn content formed in a second growth location during a second period of the single process step that follows the first period, and ZnS material without Cd predominantly formed in a third growth location during a third period of the single process step that follows the second period; and depositing a transparent conductive layer over the single buffer layer.

2. The method of claim 1, wherein the transparent conductive layer is a multilayer including a first transparent conductive film deposited on the single buffer layer and a second transparent conductive film deposited on the first transparent conductive film.

3. The method of claim 2, wherein the first transparent conductive film includes aluminum zinc oxide (Al—ZnO), and the second transparent conductive film includes indium tin oxide (ITO).

4. The method of claim 2, wherein the first transparent conductive film is thicker than the second transparent conductive film.

5. The method of claim 2, wherein the first transparent conductive film has higher electrical resistivity than the second transparent conductive film.

6. The method of claim 1, wherein the transparent conductive layer is an aluminum zinc oxide layer.

7. The method of claim 1, wherein the transparent conductive layer is an indium tin oxide layer.

8. The method of claim 1, further comprising depositing an intrinsic zinc oxide layer on the buffer layer prior to depositing the transparent conductive layer.

9. The method of claim 8, further comprising forming a conductive grid including conductive fingers and busbars over the transparent conductive layer.

* * * * *